United States Patent [19]

Gerard

[11] 4,359,695
[45] Nov. 16, 1982

[54] ELECTRONIC AMPLIFICATION SYSTEMS

[75] Inventor: Roger E. J. Gerard, Chelmsford, England

[73] Assignee: The Marconi Company Limited, Chelmsford, England

[21] Appl. No.: 171,422

[22] Filed: Jul. 23, 1980

[30] Foreign Application Priority Data

Aug. 14, 1979 [GB] United Kingdom ............... 7928256

[51] Int. Cl.³ ......................... H03F 1/32; H03F 3/68
[52] U.S. Cl. ................................. 330/151; 330/149; 330/54
[58] Field of Search ..................... 330/54, 149, 151

[56] References Cited

U.S. PATENT DOCUMENTS 4,258,328   3/1981   Prevot et al. ................. 330/149

OTHER PUBLICATIONS

Bennett et al. Feedforward—An Alternative Approach to Amplifier Linearization, May 1974, Radio & Electronic Engineering, vol. 44, No. 5, pp. 257-262.

Primary Examiner—James B. Mullins
Assistant Examiner—Gene Wan
Attorney, Agent, or Firm—Spencer & Kaye

[57] ABSTRACT

For many applications it is desirable that electronic amplifiers have good linearity (a typical such application is in the field of high frequency radio transmission). Various arrangements and designs have been employed to ensure that the desired linearity is attained, but some types of amplifier have proven rather difficult in this respect: such a type is the distributed amplifier, where the correction of amplification errors has proven particularly difficult because of the relatively large time delay (and thus signal phase difference) "across" the amplifier. The present invention seeks to provide a distributed amplifier system allowing the easier correction of amplifier errors. Specifically, the invention provides an electronic amplification system incorporating a distributed amplifier, which system comprises comparison means (12,13) for comparing the shape of the input control signal with the shape of the final output signal, and for providing a difference signal indicative of any amplifier-induced distortion, correction signal generating means ($V_9$) for forming in dependance upon the difference signal a correction signal, and combiner means (14) for combining the correction signal with the final output signal so as substantially to cancel the amplifier-induced distortion.

8 Claims, 4 Drawing Figures

ELECTRONIC AMPLIFICATION SYSTEMS

BACKGROUND OF THE INVENTION (1) Field of the Invention

This invention concerns linear electronic amplification systems, and relates in particular to methods and apparatus for improving the linearity of such systems incorporating distributed amplifiers.

(2) Description of the Prior Art

For many applications it is desirable that electronic amplifiers have good linearity—that is, that over the range concerned their output is a constant multiple of their input. A typical such application is in the field of high frequency radio transmission, where a wideband amplifier of the distributed-amplifier type feeds radio frequency power to a transmitting aerial for radiation. Various arrangements and designs have been employed to ensure either that the desired linearity is inherently attained or that any deviation from linearity is corrected by circuitry additional to the amplifier itself.

Some types of amplifier, however, have proven rather difficult in this respect: such a type is the distributed amplifier.

A distributed amplifier may be defined as an amplifier in which a number of individual amplifying members are arranged in parallel to take a control signal from one common input line and to feed an amplified signal to one common output line, the arrangement being such that the control signal arrives sequentially at each amplifying member, and such that all the individual outputs add in phase to give the maximum output. Each amplifying member thus contributes a part of the final output, which final output is effectively merely the sum of the individual parts. Distributed amplifiers are well known, and various types used as wideband amplifiers are described in, for example, our British Patent Specification No. 846,633 (corresponding to U.S. Pat. No. 3,129,387) and, more recently, in the Specification of our copending U.S. Application Ser. No. 88,063 filed Oct. 24th 1979 (I/6251/M).

A basic distributed amplifier format is described hereinafter with reference to the schematic circuit diagram of FIG. 1 of the accompanying drawings.

Distributed amplifiers are of particular value in the power amplification of high frequency signals such as those used to generate carrier waves in radio and television broadcasting. However, the correction of amplification errors in such amplifiers using tranditional techniques has proven particularly difficult because the relatively large time delay (and thus signal phase difference) "across" the amplifier has not easily allowed the precise control of both amplitude and phase at every stage that is required for good cancellation of amplifier-induced distortion. The present invention seeks to provide a distributed amplifier system allowing the easier correction of amplifier errors.

SUMMARY OF THE INVENTION

In one aspect this invention provides an electronic amplification system incorporating a distributed amplifier, which system comprises:

(a) comparison means, connected between the amplifier's input and output lines downline of the amplifier's last amplifying element, for comparing the shape of the control signal downline of the last amplifying element with the shape of the final output signal, and for providing a difference signal indicative of any amplifier-induced distortion;

(b) correction signal generating means, coupled to the comparison means, for forming in dependance upon the difference signal a correction signal which may be used to compensate for the amplifier-induced distortion; and (c) combiner means, connected between the correction signal generating means and the amplifier's output line downline of the connection with the comparison means, for combining the correction signal with the final output signal so as substantially to cancel the amplifier-induced distortion.

The distributed amplifier will usually be of the thermionic valve type, and the invention is hereinafter described utilising thermionic valves. However, it will be realised by those skilled in the art that suitable semiconductor devices may be substituted for valves, and in such a case any reference herein to "anode", "cathode" and "control electrode" (or "grid") should be construed accordingly.

The comparison means compares the amplifier's output signal shape with the control (input) signal shape; any difference is attributable to amplifier-induced distortion arising primarily from the non-linearity of the amplifier. It is not practicable to compare the full output signal, and thus a sample is taken—and naturally the output signal is sampled downline of the final amplifying element; the actual sampling technique may be any that is convenient, but is preferably effected employing a directional coupler of the transformer type. Although the control signal could be similarly sampled, this would cause unnecessary difficulties in attaining a correction signal of the desired power level (as discussed in more detail hereinafter), and thus preferably the control signal downline of the final amplifying element is actually used itself to drive the comparison means. Not only does this save power and improve efficiency (in a conventional distributed amplifier the input line is terminated by a resistance serving merely as a power-absorbing load), but, because of the amplifier's in-built "in phase" requirement between input and output lines (the delay between each inter-valve output line section matches the delay of the relevant inter-valve input line section), this minimises the problem of ensuring good phase correspondence, which in turn simplifies the shape comparison process. Although the comparison means can be, for example, an active device—such as an operational amplifier—the most convenient form of comparison means is simply a transformer to either end of the primary coil of which are fed the output line signal sample and the control line signal respectively, and from the secondary coil of which is taken the difference signal, the primary coil being "centre"-tapped with a load connecting the coil to earth. Though in general the transformer primary winding need not be tapped so that the turns either side are equal in number (and such an asymetric configuration might be of use in situations where, for other reasons, the power levels of the two signals are not the same), very conveniently they are so equal.

As will be understood, the impedance value of the load to earth will be chosen to match the characteristics the input line and the ratio of turns either side of the transformer primary coil tapping point.

The difference signal provided by the comparison means is supplied to the correction signal generating means which uses it to form a correction signal (a "negative"-antiphase-version of the distortion itself) suitable for combining with the amplifier's output so as to cancel the distortion therein (as detected by the comparison means). It will be necessary to amplify the difference signal in order to obtain the desired level of correction signal power, and any conventional amplification system can be used, for this purpose, as the correction signal generating means. Advantageously, however, the amplification system is preferably simply an additional low gain amplifying element (additional, that is, to those conventionally present in the distributed amplifier), together with an associated pre-amplifier, supplying its output to the combiner means.

It is a particularly advantageous feature of this invention that, because of the high power level of the original input line signal, the amplification system used as the correction signal generating means need only be of relatively low gain overall.

The combiner means takes the correction signal and feeds it into the amplifier's output line downline of the final amplifying element so as to cause the cancellation at that point (and thereafter) of any amplifier-induced distortion. The actual manner of achieving the desired combination is necessarily dependent upon the type of correction signal generating means employed, but when the correction signal generating means is an amplifier (as described above) the combiner means may be no more than a direct connection into the output line.

Delays introduced into the correction signal network by virtue of the comparison means, the correction signal generating means and the combiner means per se can easily be compensated for by a matching delay built into the amplifier output line between the sampling point and the combiner means.

The amplification system of the invention is of use in connection with all types of distributed amplifier. In particular, it may be used with distributed amplifiers wherein the anode line is tapered (in accordance with our aforementioned Patent Specifications), and it may be used with both single-ended and push-pull amplifiers (a modified comparison means for use with the latter type is described hereinafter with reference to FIG. 4 of the accompanying drawings).

In another aspect this invention provides a process for improving the linearity of an electronic amplification system incorporating a distributed amplifier, in which process:

(a) the shape of the control signal downline of the amplifier's last amplifying element is compared with the shape of the amplifier's final output signal;
(b) from the comparison a difference signal is derived indicative of any amplifier-induced distortion;
(c) a correction signal is formed in dependance upon the difference signal; and
(d) the correction signal is combined with the final output signal so as substantially to cancel the amplifier-induced distortion.

The system and apparatus of the invention are of particular value for use in connection with power amplifiers (that is, amplifiers where the major concern is the efficient use of the available electrical power rather than merely the quality of the amplified signal).

BRIEF DESCRIPTION OF THE DRAWINGS

The invention will now be described, though by way of illustration only, with reference to the accompanying drawings, in which.

DETAILED DESCRIPTION

Figure 1:
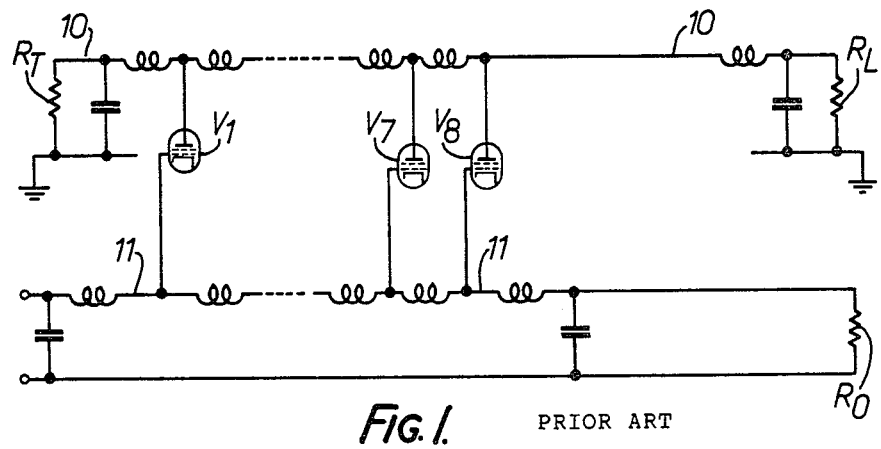
FIG. 1 shows a schematic circuit drawing of a conventional power distributed amplifier format.

In the conventional distributed amplifier of FIG. 1, eight thermionic valves ($V_1$-$V_8$) are connected in a parallel sequence via their anodes to an output line (10) having at one end a terminating resistance $R_T$ and connected at the other end to a load impedance $R_L$. All the valves' control electrodes are connected in a parallel sequence to an input line (11) terminated by a load impedance $R_o$. The delay between each inter-valve output line section matches the delay of the relevant inter-valve input line section; thus, all the outputs are in step with all the inputs, and so the outputs combine in an acceptable manner.

Figure 2:
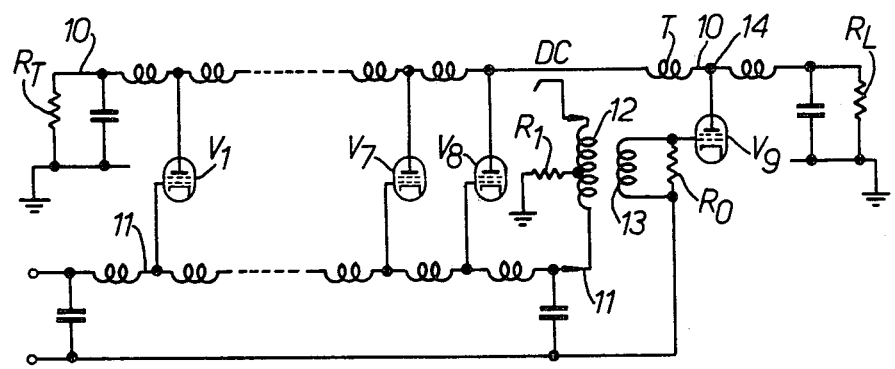
FIG. 2 shows a schematic circuit diagram of a similar amplifier modified in accordance with the invention.

The distributed amplifier according to the invention (as shown in FIG. 2) is basically very similar to that shown in FIG. 1, but has a number of additional features serving to improve the linearity. The arrangement operates as follows.

Downline of the last amplifying element ($V_8$) of the amplifier proper the output signal is sampled, using a transformer-type directional coupler (DC) described hereinafter with reference to FIG. 3, and the sample is fed to one end of the primary coil (12) of a transformer. Also downline of the last amplifying element ($V_8$) the full control signal (which, as in FIG. 1, would normally be wasted across load $R_o$) is fed to the other end of the transformer primary coil 12. In this circuit the coil 12 is centre tapped to earth via impedance $R_1$ (which has the value $\frac{1}{2}R_o$), the tapping point being such that the two "halves" of the coil are the same, and the power level of the sample taken by the directional coupler DC is adjusted to equal that of the control signal (and so is the highest possible, so that any subsequent amplification of the difference signal need be as low as possible).

The principle of operation of the comparison transformer is very simple. The two, theroretically-equal, signals are fed to either end of the primary coil 12. The circuit is designed so that the two signals are nominally at the same power level, any difference between the two (effectively the resultant formed by instantaneously substracting the two signals one from the other) must be one of shape, and thus of distortion caused by the amplifier itself, and this difference—if it exists—will cause a corresponding difference signal to be induced in the transformer secondary coil (13). The number of turns of the two halves of the primary coil 12 and the secondary coil 13 are in the ratio $1:1:\sqrt{2}$. This difference signal is then fed to the correction signal generating means amplifier (here represented solely by an additional amplifying element—$V_9$—like those in the distributed amplifier), and its power level is raised to convert it into a correction signal suitable for direct combination with the output signal carried on the output line 10. This correction signal is an equal power anti-phase version of the unwanted distortion enforced on the amplifier's output by its inherent design features; its combination with the output signal will cancel the distortion therefrom, and leave the output a perfectly linearly-amplified version of the original control signal.

In the embodiment of FIG. 2 the combination of the correction signal with the amplifier output is achieved by a simple junction (14) between the output line 10 and the amplifying element anode line.

The additional delay occasioned in the input line 11 by the transformer 12,13 and the amplifying element $V_9$ is compensated for by the additional delay element T built into the output line 10.

Figure 3:
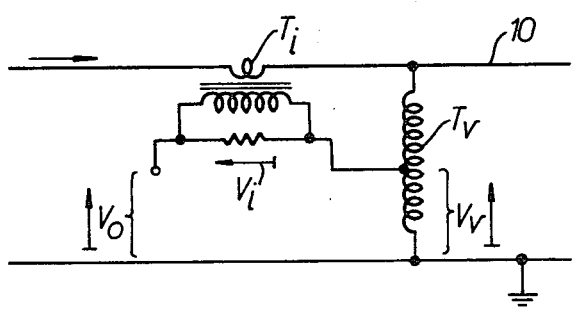
FIG. 3 shows a schematic circuit diagram of a transformer-type directional coupler suitable for use in the circuit of FIG. 2.

The directional coupler DC shown in FIG. 3 is a transformer-type coupler. Briefly, it operates as follows.

The output voltage ($V_o$) from this circuit is the vector sum of two other vectors ($V_v$ and $V_i$). The vector $V_v$ is a known fraction of the voltage across transformer $T_v$ (and is independant of the direction of any current flowing along line 10 through the transformer ($T_i$) primary), while the vector $V_i$ is proportional to the current flowing through the primary of $T_i$ (and so is dependent on the direction of current flow through the primary winding of transformer $T_i$).

When such a coupler is connected into a transmission line of characteristic impedance $Z_o$, with the power flowing in one direction only in that line, it is arranged that the vectors $V_v$ and $V_i$ are so proportioned that, after summation, complete concellation occurs. Under these conditions the output ($V_o$) from the coupler is thus zero for the direction of power flow as defined (by the arrow in the Figure). However the coupler does respond to power flowing in the other direction. Hence such a circuit gives an output in response to power flowing in one direction only, and not in the other.

Figure 4:
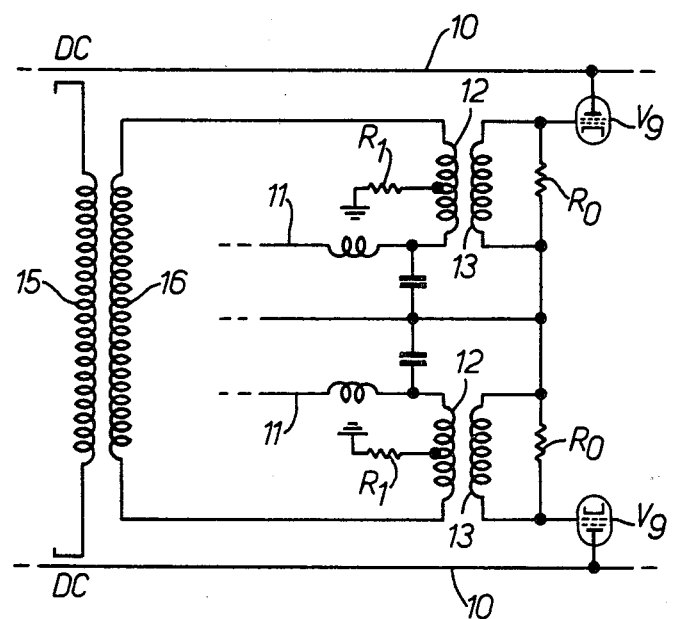
FIG. 4 shows schematically a modification to parts of the FIG. 2 circuit for operation in push-pull configuration.

FIG. 4 shows the modification necessary to the FIG. 2 circuit for operation in push-pull configuration.

A push-pull amplifier (a term well known in the art) is effectively two amplifiers having a common base line, the one being—as it were—a mirror image of the other. The two amplifying halves are arranged so that one amplifies the positive-going parts of the control signal and the other amplifies the negative-going parts; combining the two "half" outputs gives the full output (an amplified version of the full input).

As might be expected, for amplifiers operating in push-pull mode a relatively minor modification is necessary (to the circuit of FIG. 2) to cope with the fact that, for each half of the whole amplifier, the control signal is the full signal but the output signal is one or other half (positive or negative) of the amplified version. The modification required is very simple; instead of feeding "the" sample output signal directly to the comparison means, the two half outputs are first sample to each end of the primary coil (15) of a second transformer, a signal representative of the whole output is thus induced across the secondary coil (16) of this second transformer, and it is the output from this secondary coil that is fed to the comparison means. In this way the push-pull amplifier's full output signal is compared with the full control signal.

The subsequent "half" correction signal is then obtained by arranging for the correction signal generating means (as represented by each $V_9$) to output only in respect of the relevant "half".

I claim:

1. An electronic amplification system incorporating a distributed amplifier including a number of individual amplifying members arranged in parallel to take a control signal from one common input line and to feed an amplified signal to one common output line, the arrangement being such that the control signal arrives sequentially at each amplifying member, and such that all the individual outputs add in phase to give the maximum output, which electronic amplification system also comprises:

(a) comparison means, connected between the amplifier's input and output lines downline of the amplifier's last amplifying element, for comparing the shape of the control signal downline of the last amplifying element with the shape of the final power output signal, and for providing a difference signal indicative of any amplifier-induced distortion;

(b) correction signal generating means, coupled to the comparison means, for forming in dependance upon the difference signal a correction signal which may be used to compensate for the amplifier-induced distortion; and (c) combiner means, connected between the correction signal generating means and the amplifier's output line downline of the connection with the comparison means, for combining the correction signal with the final power output signal so as substantially to cancel the amplifier-induced distortion.

2. A system as claimed in claim 1, wherein the comparison means compares a sample of the amplifier's output signal with the control signal.

3. A system as claimed in claim 2, wherein the actual sampling technique is effected employing a directional coupler of the transformer type.

4. A system as claimed in claim 1, wherein the whole control signal downline of the final amplifying element is used itself to drive the comparison means.

5. A system as claimed in claim 1, wherein the comparison means is a transformer having a primary coil "centre"-tapped with a load connecting the coil to earth and a secondary coil, to either end of the primary coil are fed the output line signal sample and the control line signal respectively, and from the secondary coil is taken the difference signal.

6. A system as claimed in claim 5, wherein the transformer primary coil is tapped so that the turns either side are equal in number.

7. A system as claimed in claim 1, wherein, in order to obtain the desired level of correction signal power, the difference signal is amplified using an additional low gain amplifying element, together with an associated preamplifier.

8. A system as claimed in claim 7, wherein, the correction signal generating means including an amplifier, the combiner means is a direct connection into the output line.

* * * * *